United States Patent
Darcangelo et al.

(12)

(10) Patent No.: US 6,375,551 B1
(45) Date of Patent: Apr. 23, 2002

(54) ANGSTROM POLISHING OF CALCIUM FLUORIDE OPTICAL VUV MICROLITHOGRAPHY LENS ELEMENTS AND PREFORMS

(75) Inventors: Charles M. Darcangelo, Corning; Robert Sabia, Big Flats; Harrie J. Stevens; Paul J. Williamson, both of Corning, all of NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/587,830

(22) Filed: Jun. 6, 2000

Related U.S. Application Data

(60) Provisional application No. 60/141,140, filed on Jun. 25, 1999.

(51) Int. Cl.[7] .................................. B24B 1/00

(52) U.S. Cl. .......................... 451/41; 451/28

(58) Field of Search ............................ 451/28, 41, 36, 451/42, 285, 287

(56) References Cited

U.S. PATENT DOCUMENTS

| | | | |
|---|---|---|---|
| 5,876,268 A | 3/1999 | Lamphere et al. | 451/41 |
| 5,978,070 A | 11/1999 | Sakuma et al. | 355/53 |
| 5,983,672 A | 11/1999 | Jinbo et al. | 65/30.1 |
| 6,099,389 A | 8/2000 | Nichols et al. | 451/36 |

FOREIGN PATENT DOCUMENTS

| | | |
|---|---|---|
| JP | 11-87808 | 3/1999 |

OTHER PUBLICATIONS

Darcangelo et al., U.S. application No. 09/364,143, filed Jul. 30, 1999, Colliodal Polishing of Fused Silica, pp. 1–9.
Davis et al., U.S. application No. 09/615,621, filed Jul. 13, 1999, Extreme Ultraviolet Soft X–Ray Projection Lithographic Method and Mask Devices, pp. 1–41.
Extec Corp. Polishing Suspensions, Dec. 6, 1999, http://www.extec.com/extec/catalog/pages/p23.htm, pp. 1–4.
Photon Interaction Coefficients of Cerium, Generated by PHOTCOEF®, Dec. 6, 1999, http://www.photcoef.com/212158.html, pp. 1–4.
Periodic Table, Cerium; http://pearl1.lanl.gov/periodic/elements/58.html, Dec. 6, 1999, pp. 1–2.
Allied High Tech: Polishing Suspensions, Dec. 9, 1999, http://www.alliedhightech.com/polishing/10.html, pp. 1–2.
Chemicool, Dec. 6, 1999, http://www.chemicool.com/elements/cerium.html, pp. 1–2.
David Collier and Wayne Pantley, Laser Focus World, UV Optics, Semiconductor fabrication drives deep–UV optics, Dec. 1998, pp. 63–70.
OPTOVAC Optical Handbook, Jan. 1993.
Robert Sabia and James H. Adair, Solution and Abrasive Characterization for Glass Polishing: Investigating the Mechanisms of CMP, Jul. 1999, Corning Incorporated, Corning, NY Particulate Materials Center, The Pennsylvania State University, pp. 283–291.

*Primary Examiner*—Derris H. Banks
(74) *Attorney, Agent, or Firm*—Edward F. Murphy

(57) ABSTRACT

The invention provides a means for making below 200 nm VUV optical microlithography lens elements and preforms therefor. The inventive methods include polishing a fluoride optical lithography crystal with cerium to a surface roughness less than five angstroms. The invention includes making a 157 nm VUV optical lithography element preform by polishing a calcium fluoride crystal with cerium oxide polish.

56 Claims, 11 Drawing Sheets

ANGSTROM POLISHING OF CALCIUM FLUORIDE OPTICAL VUV MICROLITHOGRAPHY LENS ELEMENTS AND PREFORMS

CROSS-REFERENCE TO RELATED APPLICATION

This application claims the benefit of U.S. Provisional Application Serial No. 60/141,140, filed Jun. 25, 1999, entitled Angstrom Level Polishing of Calcium Fluoride, of Charles M. Darcangelo, Robert Sabia, Harrie J. Stevens and Paul J. Williamson, the content of which is relied upon and incorporated herein by reference in its entirety and the benefit of priority under 35 U.S.C. § 120 is hereby claimed.

BACKGROUND OF THE INVENTION

FIELD OF THE INVENTION

The present invention relates generally to optical lithography, and particularly to optical microlithography crystals for use in optical photolithography systems utilizing vacuum ultraviolet light (VUV) wavelengths below 200 nm, preferably below 193 nm, preferably below 175 nm, more preferably below 164 nm, such as VUV projection lithography systems utilizing wavelengths in the 157 nm region.

FIELD OF THE INVENTION

Projection optical photolithography systems that utilize the vacuum ultraviolet wavelengths of light below 200 nm provide benefits in terms of achieving smaller feature dimensions. Such systems that utilize vacuum ultraviolet wavelengths in the 157 nm wavelength region have the potential of improving integrated circuits with smaller feature sizes. Current optical lithography systems used by the semiconductor industry in the manufacture of integrated circuits have progressed towards shorter wavelengths of light, such as the popular 248 nm wavelengths, but the commercial use and adoption of vacuum ultraviolet wavelengths below 200 nm, such 193 and 157 nm has been hindered by the transmission nature of such vacuum ultraviolet wavelengths in these VUV excimer laser regions through optical materials and the surfaces of the optical materials. For the benefit of vacuum ultraviolet photolithography in the 157 nm region such as the emission spectrum VUV window of a $F_2$ excimer laser to be utilized by the semiconductor industry in the manufacturing of integrated circuits there is a need for optical lithography crystal surfaces with beneficial angstrom level roughness that can be economically and efficiently manufactured.

There is a need for an economical and efficient means for forming angstrom level roughness high quality surfaces in optical lithography fluoride crystal surfaces, such as the surface of calcium fluoride crystals that transmit 157 nm light. The polishing of calcium fluoride lithography crystals is complicated by calcium fluoride's high thermal expansion and low hardness. Prior art methods of polishing calcium fluoride VUV optical lithography surfaces are time consuming and inefficient to produce from an industrial manufacturing respect with polishing process times ranging from days to weeks. Japanese Patent Application 11 [1999]-87808 (Mar. 30, 1999) of Nikon Corp. describes a Method for Manufacturing Optical Elements for ArF Excimer Laser uses. As noted in this Nikon Corp. Japanese Patent 11-87808, optical elements for optical systems using a high-pulse ArF 193 nm excimer laser are manufactured by polishing fused silica glass with $CeO_2$ polishing agents and by polishing fluorite with diamond powder polishing agents. Cerium polishing of fluorite optical lithogaphy fluoride crystal surfaces has been avoided by the prior art due to cerium oxide contamination concerns that any cerium molecules/atoms/ions incorporated into the optical lithography fluoride crystal surface by polishing and then exposed to the highly energetic high fluence levels produced by 157 nm and 193 nm excimer lasers and used in optical lithography systems will strongly absorb the VUV light with the VUV absorbing cerium then damaging and corrupting the fluoride crystal structure and producing further detrimental VUV absorptions.

The present invention overcomes problems in the prior art and provides a polished finished optical lithography fluoride crystal surface that can be used to improve the lithographic manufacturing of integrated circuits with VUV wavelengths.

SUMMARY

The invention includes a method of making a below 200 nm vacuum ultraviolet optical microlithography lens element. The method includes providing a fluoride crystal, providing a cerium oxide polish, and polishing the fluoride crystal with said cerium oxide polish to provide an optical microlithography element.

In another aspect, the invention includes a method of making a below 200 nm optical microlithography element preform. The method of making a below 200 nm optical microlithography element preform includes providing a fluoride crystal, providing a cerium polish, and polishing the fluoride crystal with the cerium polish to provide a microlithography element polished preform.

In a further embodiment the invention includes a method of making a below 170 nm optical microlithography preform. The method of making the below 170 nm optical microlithography preform includes providing a calcium fluoride crystal having a 157 nm internal transmission greater than 95%/cm and providing a cerium polish. Preferably the cerium polish includes cerium oxide particles in an acidic polishing environment. The method includes polishing the calcium fluoride crystal with the cerium polish to provide a VUV microlithography polished preform surface.

In a further aspect the invention includes a method of making a 157 VUV optical element preform. The method includes providing a calcium fluoride crystal with a 157 nm internal transmission>95%/cm. The method includes providing a cerium means for polishing the crystal into a 157 nm VUV optical element preform with a polished preform surface roughness less than 5 angstroms. The method includes polishing the calcium fluoride crystal with the cerium polishing means to a surface roughness less than five angstroms.

In another aspect, the invention includes a method of making a below 200 nm optical microlithography element preform. The method of making a below 200 nm optical microlithography element preform includes providing a fluoride crystal, providing an aqueous polish, and polishing the fluoride crystal with the aqueous polish to provide a microlithography element polished preform.

DETAILED DESCRIPTION

The invention includes a method of making a below 200 nm VUV optical microlithography lens element. In a preferred embodiment the optical microlithography lens element is a 193 nm lens element. In a more preferred embodiment the optical microlithography lens element is a 157 nm lens element. The method includes providing a fluoride crystal and a cerium oxide polish, and polishing the fluoride crystal with the cerium oxide polish to provide a VUV optical microlithography element with a surface roughness less than five angstroms, particularly surface roughness RMS (Root Mean Square Roughness) and Ra (Average Roughness) below five angstroms. Preferably the cerium oxide polish is an aqueous polish.

Figure 1:
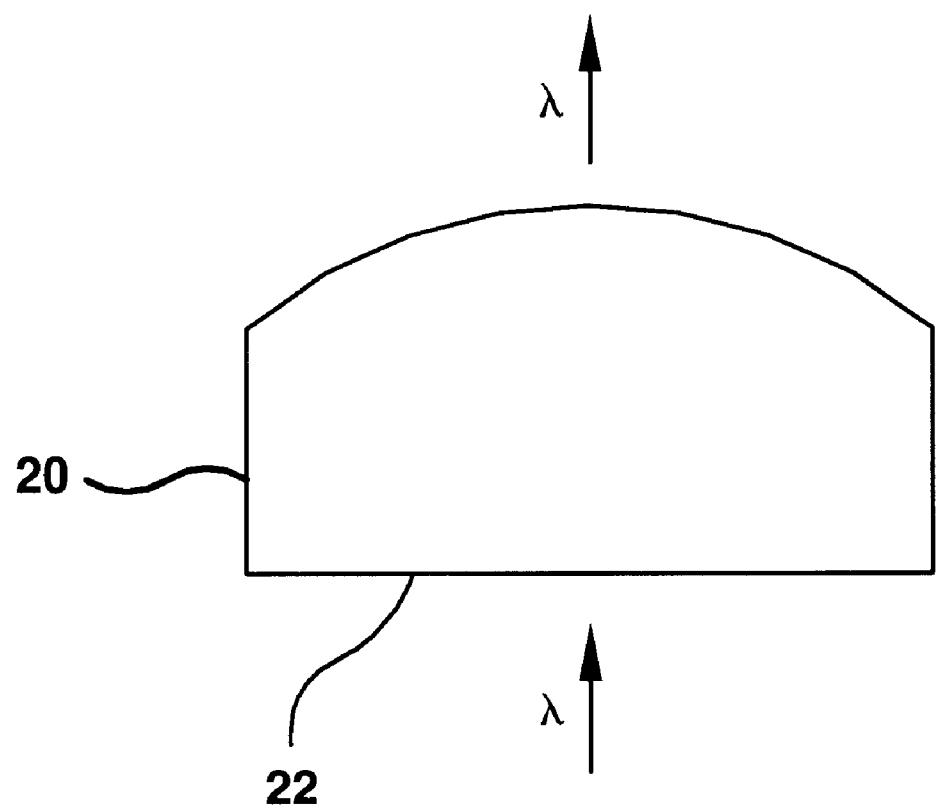
FIG. 1 is a side cross section view of an embodiment of the invention.

FIG. 1 shows a below 200 nm VUV optical microlithography lens element 20 with a polished lens element surface 22.

Figure 2:
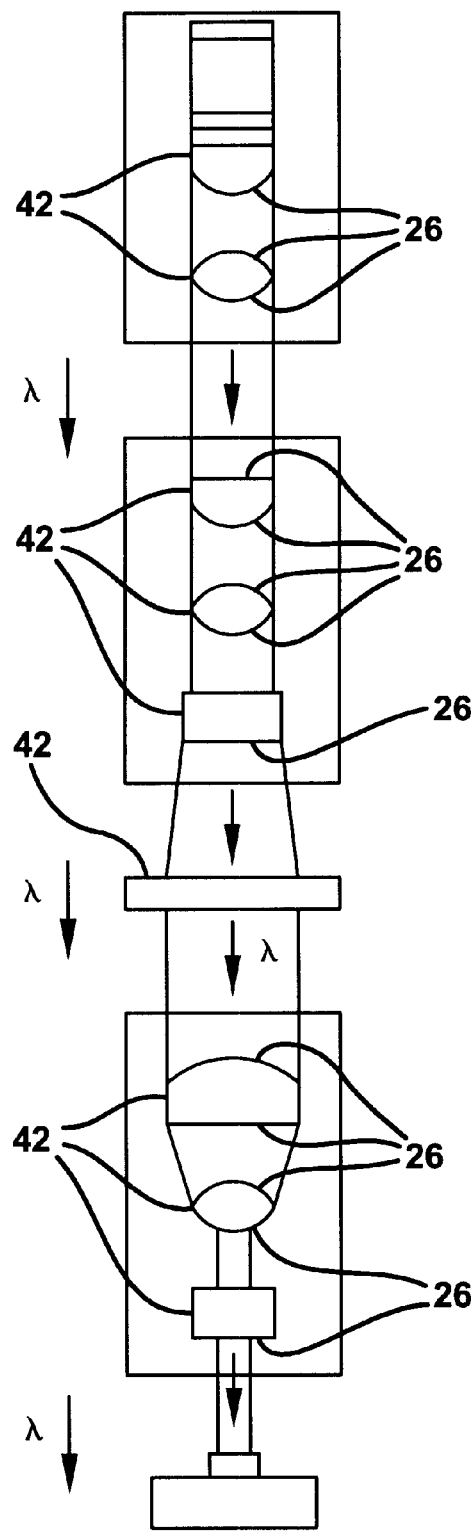
FIG. 2 shows an embodiment of the invention.
Figure 3:
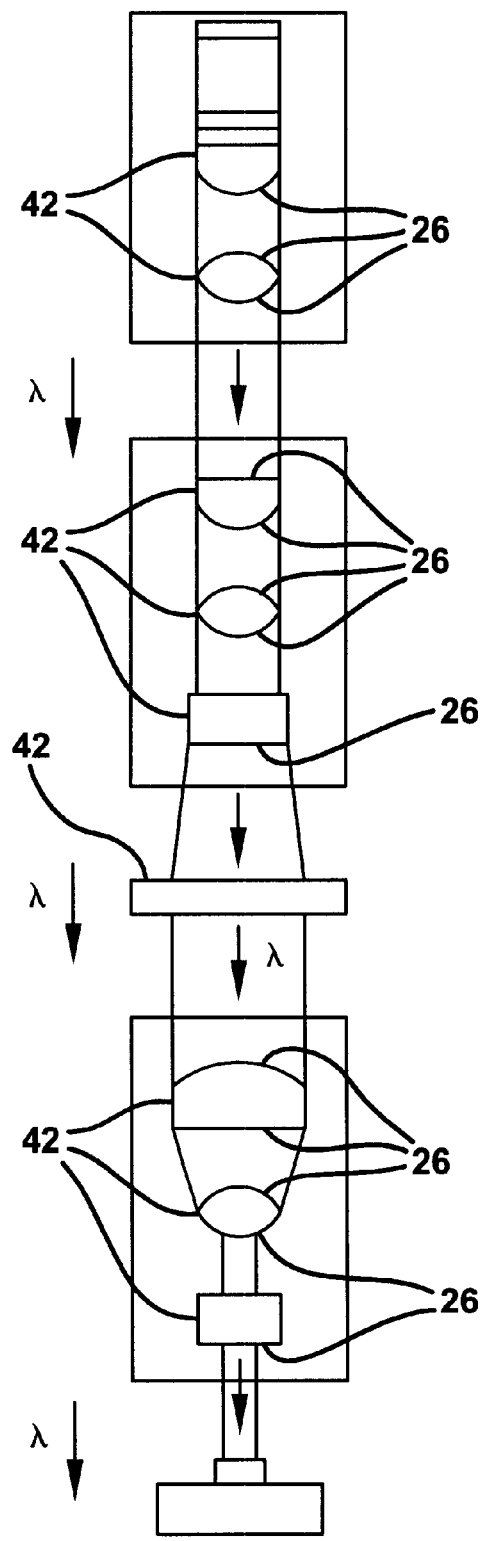
FIG. 3 shows an embodiment of the invention.

As shown in FIG. 2 and 3, optical microlithography element 42 with finished polished optical surfaces 26 form the optical train of a below 200 nm VUV optical microlithography system, which preferably includes a below 200 nm VUV laser radiation source, a lithography illumination optics system, a lithography mask stage, a lithography projection optics system, and a wafer stage. FIG. 2 shows a 193 nm VUV optical microlithography system which utilizes 193 nm optical microlithography elements 42 to manipulate 193 nm optical microlithography radiation produced by a 193 nm ArF excimer laser to form microlithography patterns on a wafer in the wafer stage. FIG. 3 shows a 157 nm VUV optical microlithography system which utilizes 157 mn optical microlithography elements 42 to manipulate 157 nm optical microlithography radiation produced by a 157 nm fluorine excimer laser to form microlithography patterns.

Figure 4:
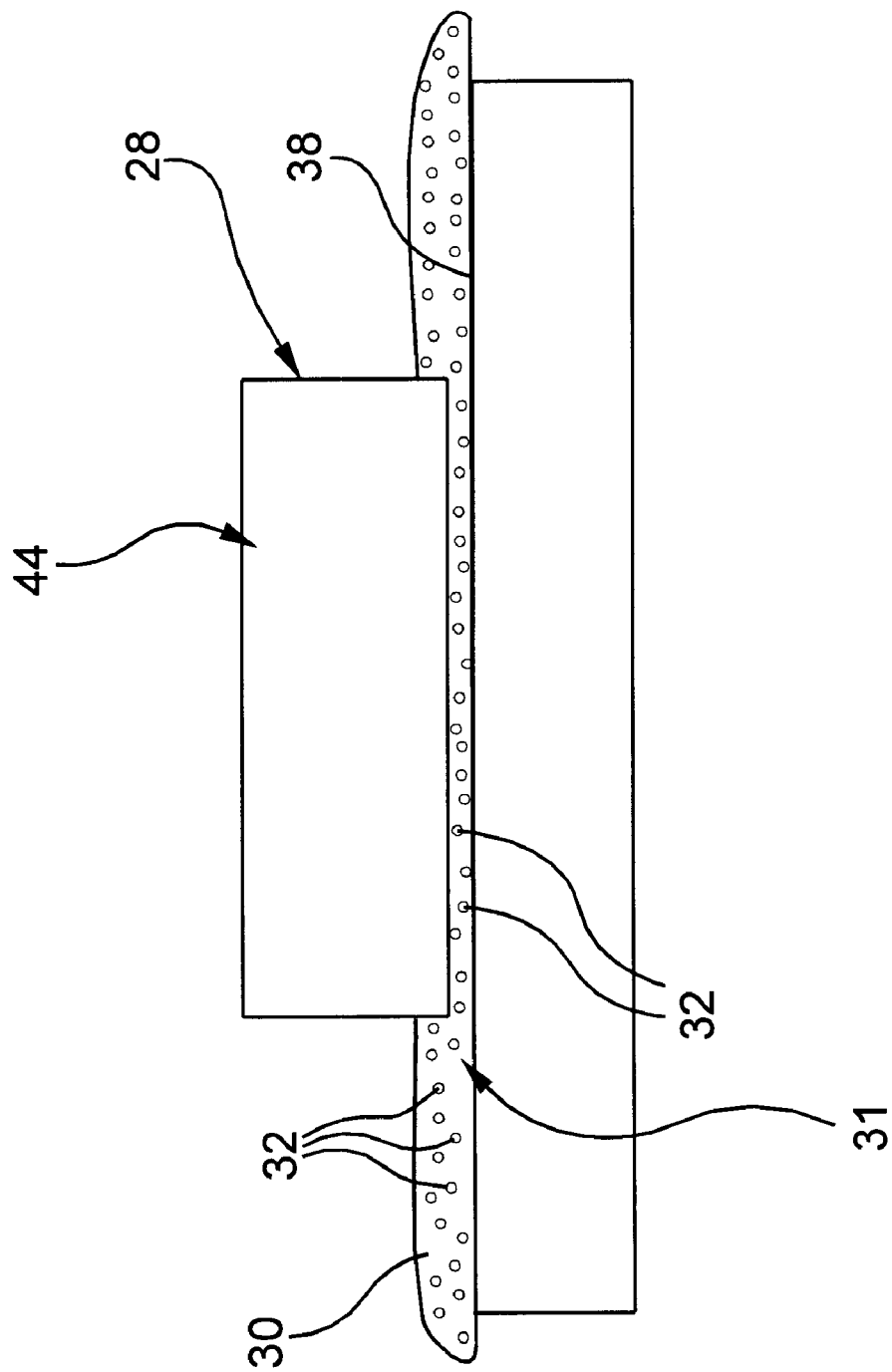
FIGS. 4 and 5 shows a method of the invention.
Figure 5:
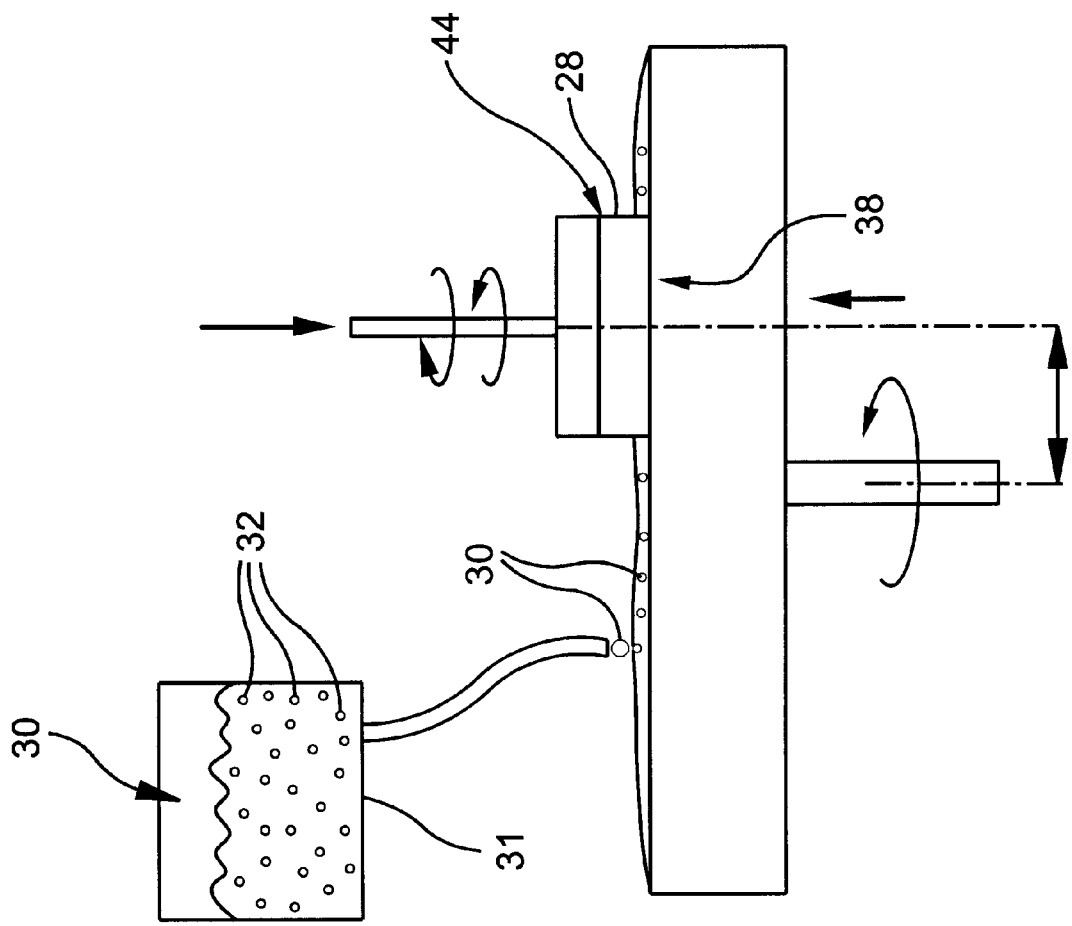

The method of making a VUV optical microlithography element includes providing a fluoride crystal, providing a cerium oxide polish, preferably an aqueous polish, and polishing the fluoride crystal with the polish to provide a VUV optical microlithography element with a surface roughness less than five angstroms. As shown in FIG. 4 and FIG. 5, fluoride crystal 28 is polished with cerium oxide polish 30 which includes cerium oxide abrasive particles 32. Polishing fluoride crystal 28 with cerium oxide polish 30 efficiently provides a means for forming a VUV optical microlithography element with a surface roughness less than five angstroms. Preferably the cerium oxide polish has a pH in the range of 2 to 12, more preferably 3 to 7, and more preferably about 4 to 6, and most preferably about 5. Preferably the solubility of the cerium oxide in the polish solution is less than 1.0 ppm.

In a preferred embodiment of the method, providing fluoride crystal 28 comprises providing a calcium fluoride crystal. The provided calcium fluoride crystal preferably has a 157 nm internal transmission greater than 95%/cm and more preferably >99%/cm. Preferably providing the calcium fluoride crystal includes providing a calcium fluoride crystal that consists essentially of Ca and F. Preferably the calcium fluoride crystal has a cerium impurity level of less than 0.5 ppm Ce by weight. Preferably the calcium fluoride crystal has an impurity level of less than 1 ppm Pb by weight, less than 2 ppm Na by weight, and less than 2 ppm K by weight.

In an alternative embodiment of the method, providing a fluoride crystal 28 includes providing a barium fluoride crystal. Preferably the provided barium fluoride crystal consists essentially of Ba and F.

The method preferably includes exposing the VUV optical microlithography element to below 200 nm VUV optical lithography radiation. Preferably exposing the element comprises exposing the VUV optical microlithography element to 157 nm optical lithography radiation, such as produced by a fluorine excimer laser radiation source.

In a further embodiment, exposing the element comprises exposing the VUV optical microlithography element to 193 nm optical lithography radiation, such as produced by a ArF excimer laser radiation source.

Preferably polishing the fluoride crystal includes an additional polishing with a decontaminating colloidal silica polish, preferably an aqueous polish, after polishing the fluoride crystal with the cerium oxide polish. In an embodiment of the invention, the fluoride crystal is first cerium polished with a hard polishing pad with a hardness H, and then cerium polished with a soft polishing pad with a hardness S wherein H>S, most preferably with the polishing pads being polyurethane polishing pads. Preferably a first cerium oxide polish with large size cerium oxide particles is used with the hard polishing pad, then a second cerium oxide polish with small size cerium oxide particles is used with the soft polishing pad with the small size particle size less than the size of the large size particles (small size<large size).

Preferably polishing the fluoride crystal includes polishing the fluoride crystal with the cerium oxide polish to provide a microlithography element polished preform which has a preform surface roughness less than five angstroms and then forming the polished preform into the VUV optical microlithography element. Preferably forming the polished preform into the microlithography element comprises shaping the preform into a lens which operates on below 200 nm optical lithography light.

In a further aspect the invention includes a method of making a below 200 nm VUV optical microlithography element preform, preferably a 157 nm optical microlithography element preform. The method of making a below 200 nm optical microlithography element preform includes providing a fluoride crystal, providing a cerium polish, and polishing the fluoride crystal with the cerium polish to provide a VUV microlithography element polished preform with a surface roughness less than five angstroms. Preferably the cerium polish is an aqueous polish. Preferably providing a fluoride crystal includes providing a calcium fluoride crystal, most preferably which consists essentially of Ca and F. Alternatively providing a fluoride crystal includes providing a barium fluoride crystal, most preferably which consists essentially of Ba and F.

Figure 6:
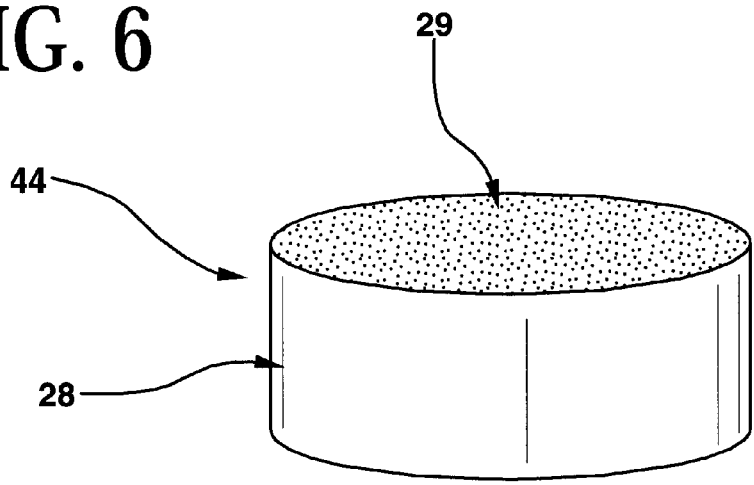
FIGS. 6–9 illustrate a method of the invention.
Figure 7:
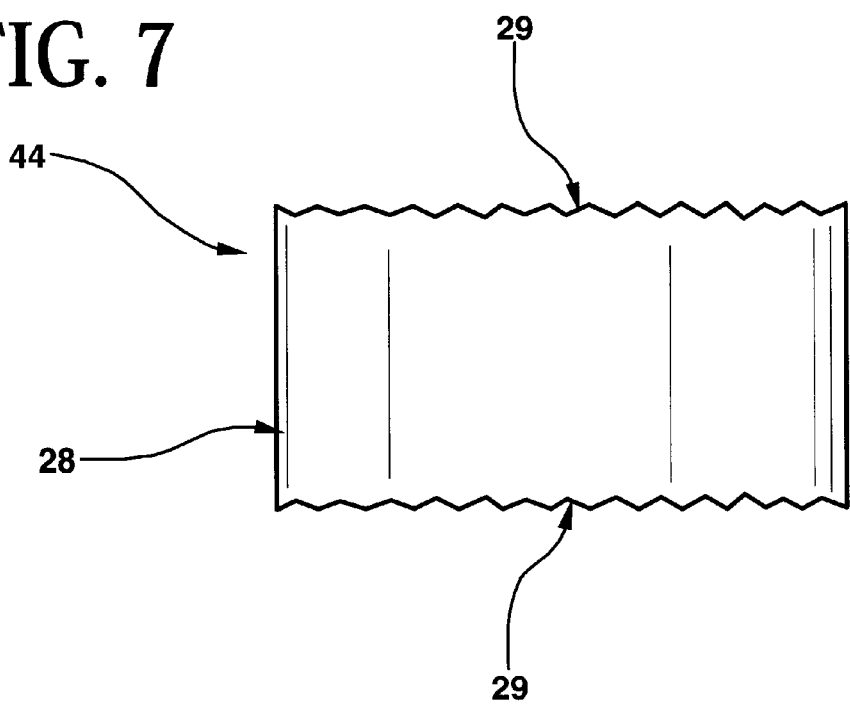
Figure 8:
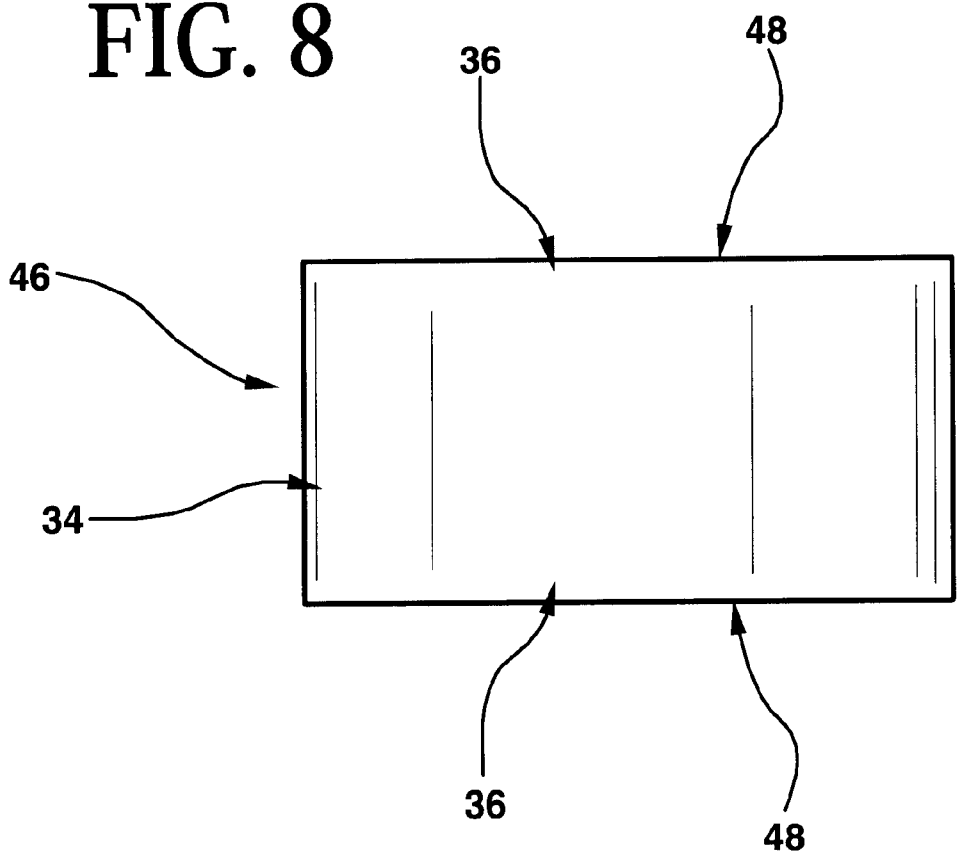
Figure 9:
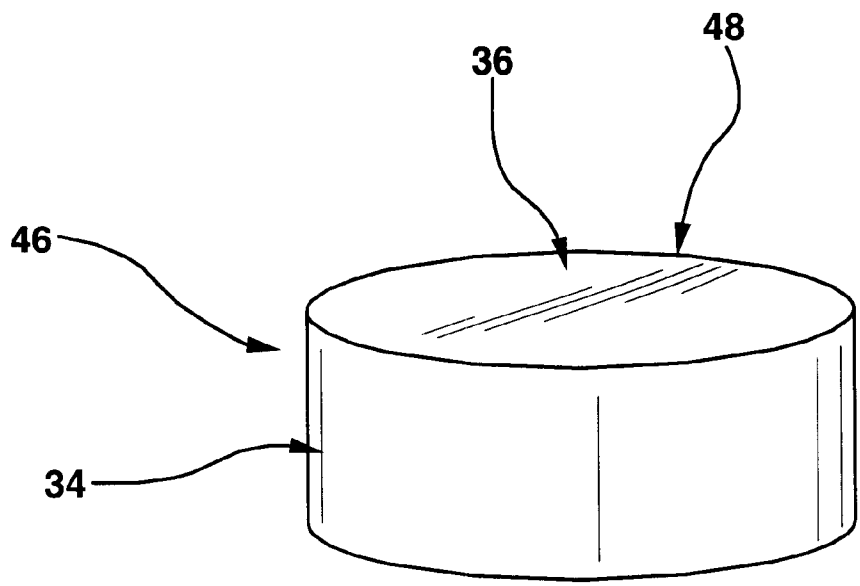

As shown in FIG. 6 and FIG. 7 which is a side view of FIG. 6, the invention includes providing fluoride crystal 28. Fluoride crystal 28 has unfinished top and bottom surfaces 29. The unfinished fluoride crystal surfaces have roughness greater than five angstroms, preferably greater than twenty angstroms, more preferably greater than fifty angstroms, most preferably greater than 100 angstroms. Even with such greater than 100 angstrom rough unfinished starting surfaces, the invention can achieve below 5 angstrom roughness surfaces with low processing times, preferably overall polishing times less than 2.5 hours. As shown in FIG. 4 and FIG. 5 the invention includes providing a cerium polish 30 and polishing fluoride crystal 28. Polishing fluoride crystal 28 with the cerium polish provides a microlithography element polished preform 34 with polished preform surfaces 36. The cerium polish results in polished preform surfaces 36 which have surface roughness less than five angstroms. The polished surface roughness RMS (Root Mean Square Roughness) and Ra (Average Roughness) are polished to below 5 angstroms.

Preferably polishing fluoride crystal 28 with aqueous cerium polish 30 includes cerium polishing the unfinished surfaces 29 into polished preform surfaces 36 with a surface finish which has a RMS less than two angstroms and a Ra less than two angstroms.

In accordance with the invention the VUV microlithography element preform is provided by cerium polishing the fluoride crystal to a surface finish with roughness RMS<5 angstroms and Ra<5 angstroms, and more preferably RMS<2 angstroms and Ra<2 angstroms, most preferably with fluoride crystal 28 comprising a calcium fluoride crystal. Preferably the cerium polish 30 has a pH from 2–12, more preferably from 3 to 7, preferably from 4 to 6, and most preferably a pH of about 5 (5±0.5). Providing cerium polish 30 preferably includes providing cerium oxide abrasive particles 32 in polishing environment 31, preferably an acidic aqueous polishing environment. Preferably the solubility of the cerium oxide abrasive in the polish environment solution is less than 1.0 ppm by weight. Preferably polishing includes polishing with a synthetic polymer polyurethane polishing pad 38. Preferably polishing includes polishing with a low polishing pad pressure less than 2 PSI, more preferably a polishing pressure in the range from about 1 to 1.5 PSI. In the preferred practice of the method polishing includes polishing for a total polishing time of less than five hours, more preferably less than 3 hours, and most preferably with an overall total polishing time less than 2.5 hours, such as about 135 minutes. Preferably cerium polishing crystal 28, includes polishing with a hard polishing pad 38 having a hardness H and then polishing with a soft polishing pad 38 having a hardness S wherein H>S. Preferably hard polishing pad 38 hardness H is greater than 25 shore D hardness, more preferably >30, and hardness S is less than 25 shore D hardness. Preferably the hard polishing pad shore D hardness is about 50 (50±25, more preferably 50±20). In a preferred embodiment cerium polishing includes polishing with a first cerium polish with large cerium abrasive particles having a particle size of about LPS, and then polishing with a second cerium polish with small cerium abrasive particles having a particle size of about LPS, and then polishing with a second cerium polish with small cerium abrasive particles having a particle size of about SPS wherein LPS>SPS. In a particularly preferred embodiment of the invention, the method includes following the cerium polishing with a polishing of colloidal non-cerium abrasive particle silica polish. Preferably the colloidal silica polish has a pH>7, preferably with a pH in the range of about 10 to 12. In a preferred embodiment the method of making the below 200 nm VUV optical microlithography element preform includes exposing the polished crystal below 5 angstrom finished surfaces to 157 nm laser radiation. Such exposing preferably includes measuring the crystalline optical properties, such as the 157 nm transmission.

The invention further includes a method of making a below 170 nm VUV optical microlithography preform. The method of making the below 170 nm VUV optical microlithography preform includes providing a calcium fluoride crystal. Preferably the provided calcium fluoride crystal has a 157 nm internal transmission greater than 95%/cm. The method further includes providing a cerium polish. Preferably the cerium polish has a pH from 2–12, more preferably 3 to 7, and more preferably 4 to 6 and most preferably about 5. Preferably the cerium oxide solubility in the polishing environment solution is less than 1 ppm. Preferably the provided cerium polish includes a plurality of cerium oxide particles in an acidic polishing environment. The method includes polishing the calcium fluoride crystal with the cerium polish to provide a VUV microlithography polished preform.

As shown in FIG. 6–7, the method includes providing calcium fluoride crystal 44. Calcium fluoride crystal 44 preferably has a 157 nm internal transmission greater than 95%/cm, more preferably >99%/cm. 157 nm internal transmitting calcium fluoride crystal 44 preferably consists essentially of Ca and F. Calcium fluoride crystal 44 preferably has a cerium impurity level of less than 0.5 ppm Ce by weight. Preferably calcium fluoride crystal 44 has an impurity level of less than 1 ppm Pb by weight, less than 2 ppm Na by weight, and less than 2 ppm K by weight.

As shown in FIG. 4–5, the method includes providing a cerium polish 30. Preferably cerium polish 30 includes cerium oxide particles 32. Preferably cerium oxide particles 32 are in an aqueous polishing environment 31. In a preferred practice the provided cerium polish is acidic. The method includes polishing calcium fluoride crystal 44 with the cerium polish 30 to provide a calcium fluoride VUV microlithography polished preform 46 with polished preform surface 48. Polishing the unfinished surfaces of calcium fluoride crystal 44 with cerium polish 30 provides a below 170 nm, preferably a 157 nm VUV microlithography element polished preform surface with a surface roughness less than 5 angstroms, preferably <2 angstroms.

Figure 10:
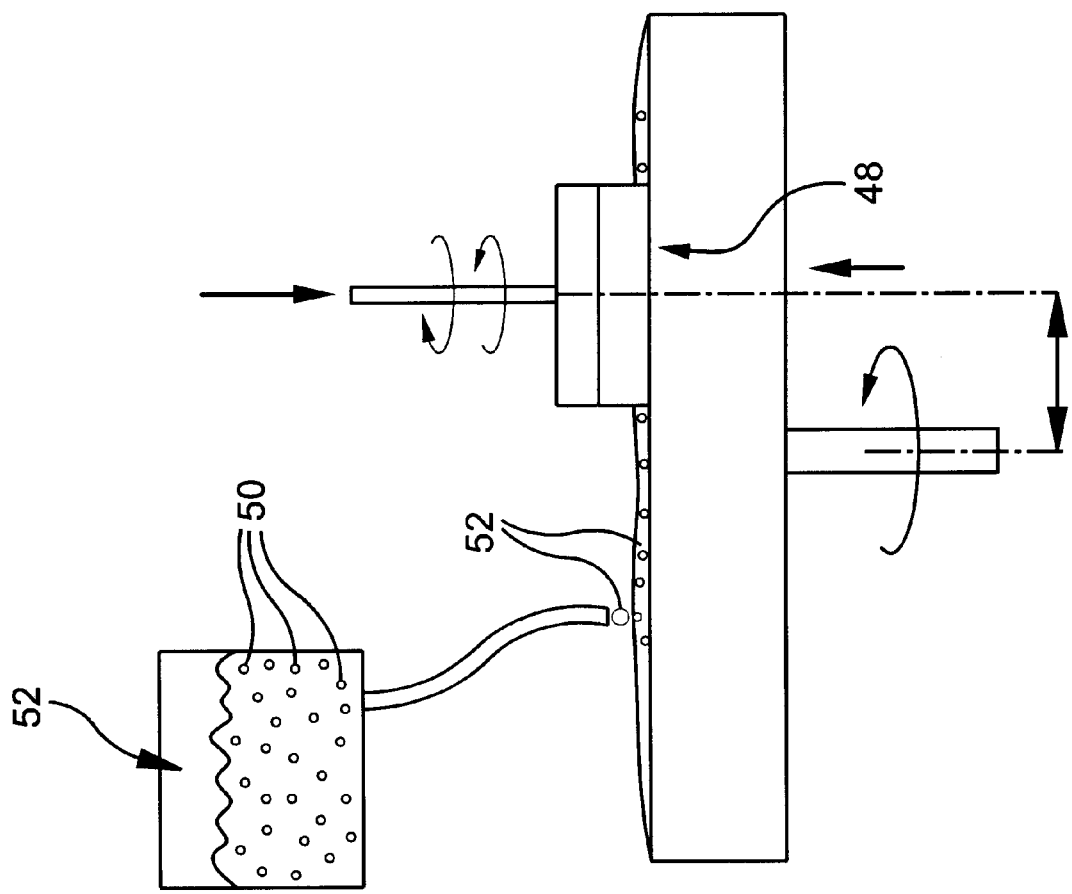
FIG. 10 shows a method of the invention.
Figure 12:
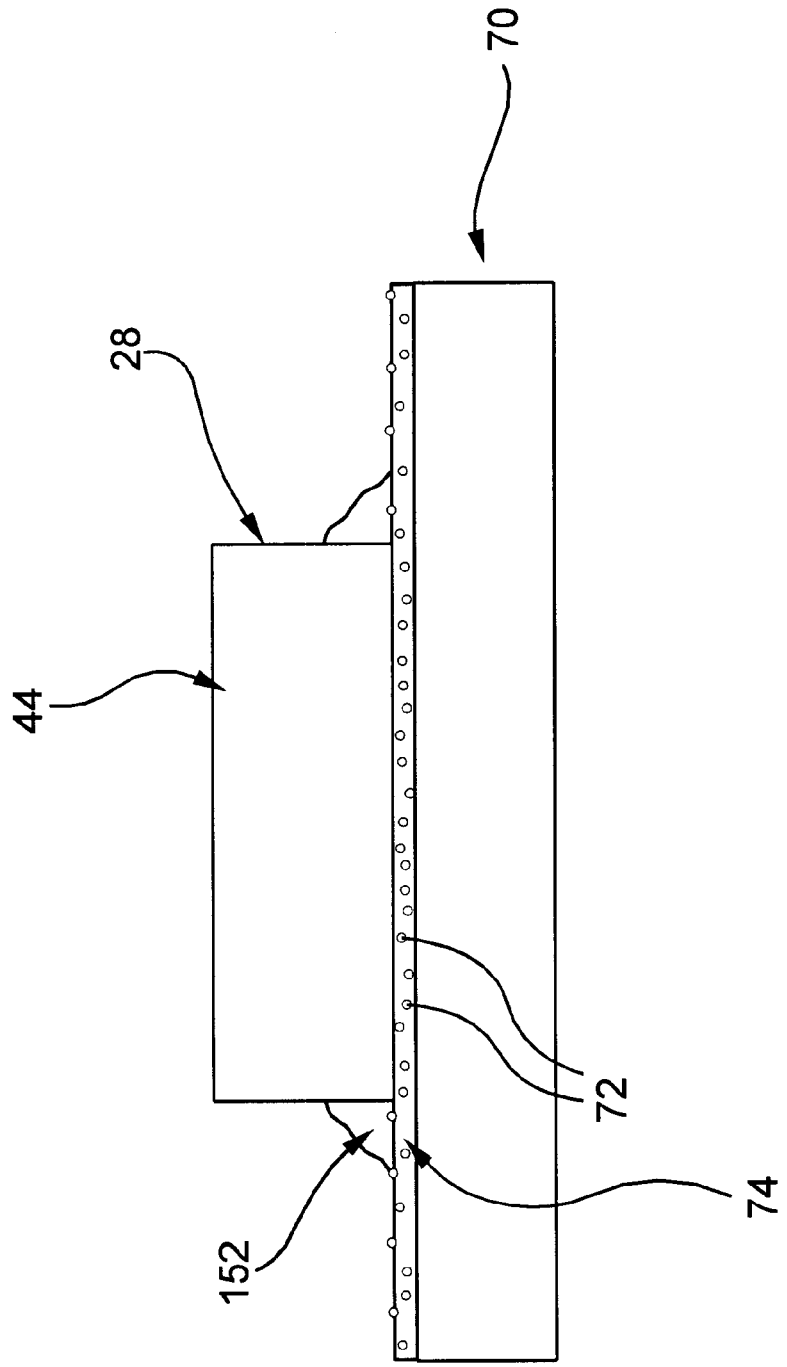
FIG. 12 shows a method of the invention.
Figure 13:
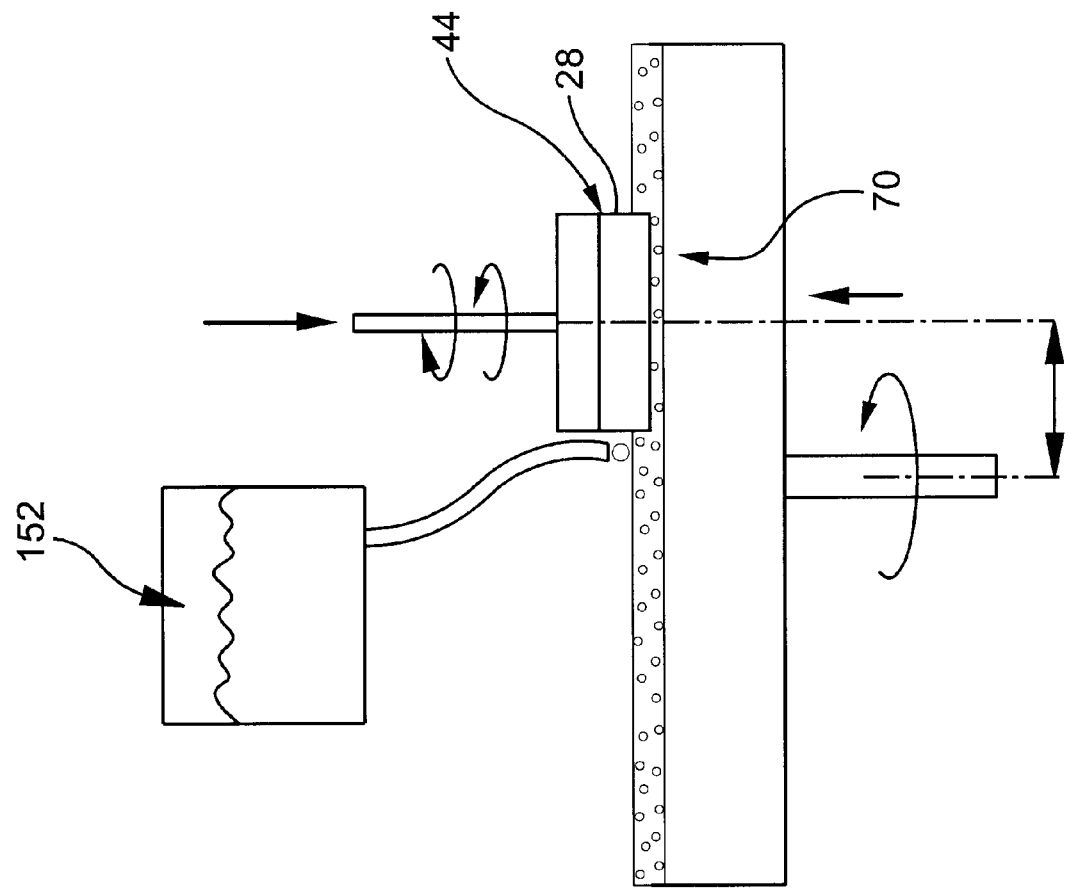
FIG. 13 shows a method of the invention.

In a preferred embodiment, the method of making the below 170 nm microlithography preform includes decontaminating the polished preform surface which has been polished with the cerium polish, preferably with the cerium polish cerium oxide solubility less than 1 ppm in solution. Decontaminating the cerium polished preform surface preferably includes removing contaminant particles from the cerium polished preform surface, and more preferably removing any residual contaminant cerium particles left on the polished preform surface. Preferably decontaminating the cerium polished preform surface includes removing reaction products from the cerium polished preform surface, and more preferably removing any cerium polish reaction products from the polished preform surface. Decontaminating preferably includes finishing preform surface 48 with cerium-free non-reactive abrasives such as with cerium-free particles 50, preferably colloidal abrasive particles. As shown in FIG. 10, finishing preform surface 48 preferably includes using decontaminating finishing colloid 52 to clean finish and decontaminate the cerium polished preform surface so that cerium related contaminants are removed and washed away. In a preferred embodiment colloidal silicon dioxide ($SiO_2$) silica is used as the decontaminating colloid. Finishing the cerium polished preform surface 48 preferably includes using an aqueous >7 pH colloidal silica solution preferably with a pH of about 10 to 12. Preferably a virgin clean unused finishing polyurethane soft polishing pad is used with an appropriate flow of the colloidal silica to clean the preform surface. Preferably a finishing polishing load pressure less than 2 PSI is used with the polyurethane pad and colloidal silica, with the finishing time in the range of about 15±10 minutes. An alternative decontaminating finishing colloid 52 is a colloidal alumina (aluminum oxide) ($Al_2O_3$). A further alternative decontaminating colloid 52 is colloidal diamond. A further decontaminating colloid colloidal abrasive particle is colloidal zirconium dioxide ($ZrO_2$). A farther decontaminating colloidal abrasive particle is titanium dioxide ($TiO_2$). An alternative decontaminating finishing with cerium-free particles includes finishing with a fixed abrasive pad 70. FIGS. 12 and 13 show decontaminating finishing with a fixed abrasive pad 70 which includes abrasive particles 72 fixed in solid binding material 74 such as resin or wax. Preferably a particle-free solvent fixed abrasive liquid 152, such as water, is used with fixed abrasive pad 70. Decontaminating finishing with a fixed abrasive pad includes finishing with a diamond containing pad, an aluminum oxide containing pad, a silicon dioxide containing pad, a zirconium dioxide containing pad, or a titanium dioxide containing pad. The decontaminating finishing step does not significantly degrade the surface quality of the polished preform surface, and preferably improves the surface quality, preferably with the cerium-free abrasive particles being non-reactive abrasives which do not chemically react with the fluoride crystal. The cerium-free abrasive decontaminating particles can be precipitated particles, flame hydrolyzed particles or metal oxide sintered and milled particles. Preferably the cerium-free abrasive decontaminating particles have a particle size less than 500 nm, and more preferably less than about 100 nm. Providing the decontaminated microlithography fluoride crystal<5 angstrom surfaces preferably includes cleansing the polished surfaces while the polish surfaces are still wetted by the polish process. Particularly the cerium polish is cleansed from the surface after termination of a polishing segment before the cerium polish is allowed to dry on the surface. A preferred decontaminated and cleansed surface is achieved by cleansing in a segragated cleaning work station that is seperated from the polishing work stations. Preferably cleansing quickly follows termination of polishing to ensure the wet polished surface are cleansed of the polish before the surface are allowed to dry. Cleansing preferably includes washing with a mixture of deionized water and cleaning solution such as Micro-90 brand Concentrated Cleaning Solution for Critical Cleaning, Catalog#9031 from International Products Corp., PO Box 70, Burlington, N.J. 08016-0070, wiping with a virgin cleanroom cleaning sponge, and rinsing with distilled water. Micro-90 brand Concentrated Cleaning Solution for Critical Cleaning includes water, glycine, ethanediylbis tetrasodium salt, benzenesulfonic acid, dimethy-ammonium salt, and nitrilotris(ethanol). Preferably all polishing is immediately followed with cleansing of the polished surface. In a particularly preferred embodiment the invention includes polishing with using a multitude of short polishing segments (preferably time length of about 15 minutes (plus/minus 10 minutes)). Preferably these short polishing time segments are followed with cleansing of the surface.

Preferably in the making of the below 170 nm VUV optical microlithography preform, providing the cerium polish includes utilizing cerium polish 30 with a pH in the range of about 2 to 12, more preferably 3 to 7 pH, more preferably a pH from 4 to 6, and most preferably a pH of about 5 (5±0.5). In an embodiment of the invention, the method includes using a cerium polish acidic polishing environment which includes a non-water liquid. The non-water liquid component of the polishing environment slows down the chemical activity of the aqueous polish by lowering the water content of the polish. A polishing environment such as about 50% water and 50% ethylene glycol provides for slowing of the cerium polish chemical reactivity by lowering its water content.

Preferably polishing includes polishing with synthetic polyurethane polishing pads 38. Preferably polishing includes polishing with a first hard polishing pad having a hardness H and then polishing with a second soft polishing pad having a hardness S with H>S. Preferably the hard polishing pad of the invention has a hardness H >25 shore D hardness and the soft pad has a hardness S<25 shore D hardness. Preferably the first polishing pad has a shore D hardness$\geq$30, and more preferably in the range of about 30 to 75.

The methods of the invention provide means for generating <5 angstrom surface on calcium fluoride using cerium oxide abrasives in conjunction with polyurethane polishing pads under low pressure and in slightly acidic environments. Resulting less than five angstroms high quality 157 nm lithography surfaces have a total polishing time of less than 2.5 hours. In a preferred embodiment the present invention provides polishing of calcium fluoride (CaF2) using a combination of cerium oxide abrasives and polyurethane pads. The process includes a first stage in which surface and subsurface damage remnant from lapping is removed using a hard pad, followed by a second stage in which a softer pad is used to improve the surface. Both steps incorporate cerium oxide abrasive in slightly acidic environments (pH~5) and low pressures (~1–1.5 PSI), and result in a final surface quality of Ra and RMS<2 angstroms. This invention preferably utilizes cerium oxide abrasives on a combination of hard and soft polyurethane pads at pH~5.0 to generate surface finishes between 1.5–2.0 angstrom (Ra and RMS values). Further processing using high pH (~10) colloidal silica solutions further improve the surface finish to a Ra<1.3 Å. Overall polishing time is less than 2.5 hours.

EXAMPLES

Ground and lapped calcium fluoride ($CaF_2$) was polished using high purity cerium oxide abrasives dispersed to pH~5.0 on polyurethane pads. The first step was to use a cerium oxide (Product Name Opaline, from Rhodia Rare Earths, La Rochelle, France) with a relatively large particle size of 2.76 μm on a polyurethane pad with a Shore D hardness of 38 (Product Code MHC-14B, from Rodel Incorporated, Newark, DE 19713). Polishing was performed on a single-sided machine with load set at 1.2 PSI and wheel speed at 50 RPM. Surface analysis was performed every 15 minutes using a scanning white light interferometer, observing improvement in surface finish. Surface analysis was preceded by cleansing of the polished surface. Cleansing quickly followed termination of polishing to ensure the wet polished surface was cleansed of the polish before the surface was allowed to dry. Cleansing included washing with a mixture of deionized water and cleaning solution (Micro-90 brand Concentrated Cleaning Solution for Critical Cleaning, Catalog #9031 from International Products Corp., PO Box 70, Burlington, N.J. 08016-0070) which includes water, glycine, ethanediylbis tetrasodium salt, benzenesulfonic acid, dimethy-ammonium salt, and nitrilotris (ethanol), wiping with a virgin cleanroom cleaning sponge, and rinsing with distilled water. The first polishing step was terminated when the surface analysis revealed decreasing polishing performance (at 90 minutes). The second polishing step incorporated a different abrasive and pad from the first. The cerium oxide abrasive was also dispersed at pH~5.0, but had a lower particle size of 1.6 μm (Product Name Hastelite 919 from James H. Rhodes & Co. Division of Universal Photonics, Hicksville, N.Y. 1180 1). The polishing pad was a soft, polyurethane polishing pad (Product Code 204, from Rodel Incorporated, Newark, DE 19713). Polishing time for the second step was limited to 30 total minutes. The third polishing stage consisted of using an unused pad identical to that used in the second polishing stage, with the abrasive being a colloidal silica dispersed at pH~10 (Product Code A2095, from Cab-O-Sil Division of Cabot Corporation, Tuscola, Ill. 61953). Polishing time was 15 minutes under the same polishing conditions as for stages 1 and 2 (first and second polishing steps).

Figure 11:
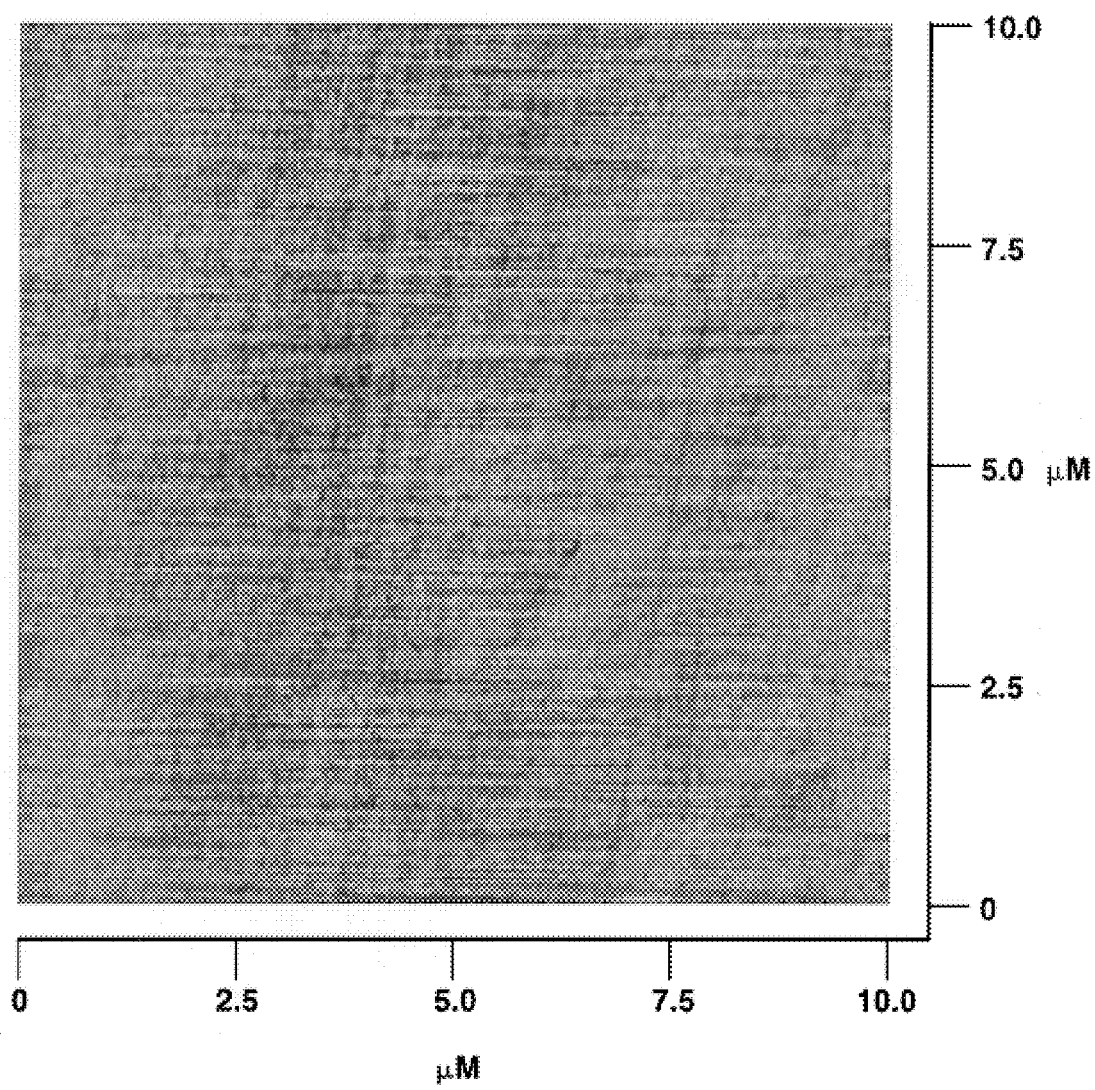
FIG. 11 is an atomic force photomicrograph (AFM) of a calcium fluoride surface after 135 minutes of polishing processing time in accordance with the invention, with the side scales in μm and the surface having a roughness Ra=1.3 and a RMS=1.7 angstroms.

Results for Surface analysis performed every 15 minutes using scanning white light interferometry are shown in Table 1. A maximum surface quality of RMS=69.9 Å and Ra=55.5 Å was achieved after the first polish stage. After the second polish stage, the surface was improved to RMS=5.5 Å and Ra=4.3 Å. The third polish resulted in what appears to be a degradation in surface quality (RMS=8.8 Å and Ra=6.9 Å). However, it is important to understand that the ability of scanning white light interferometry in resolving <10 Å surfaces is limited. As a result, atomic force microscopy was used to differentiate surface quality for both prior to and immediately after the third polishing stage. Results showed that the surface both before and after the third polishing stage revealed no surface defects (i.e., scratches, pits, etc.). AFM measured roughness values for the surface before the third stage polish were RMS =2.0 Å and Ra=1.5 Å. The third stage polish improved the surface roughness to RMS =1.7 Å and Ra=1.3 Å (see FIG. 11). FIG. 11 is a AFM photomicrograph of a section of the finished calcium fluoride surface with the side dimension scales of the section in $\mu$m (micrometer).

Table 1. Surface analysis results as a function of test time for the three polishing steps. The first polish step was terminated when the surface quality began to degrade (after 90 minutes). The second and third polishing steps were limited to 30 and 15 minutes respectively. Surface quality was measured using scanning white light interferometry (SWLI) in terms of peak-to-valley (PV) total roughness, (Rt), root mean square roughness (RMS), and average roughness (Ra), and atomic force microscopy (AFM) in terms of RMS and Ra only.

TABLE 1

| Polishing Step | Polishing Time (minutes) | Rt (nm) SWLI | RMS (Å) SWLI | Ra (Å) SWLI | RMS (Å) AFM | Ra (Å) AFM |
| --- | --- | --- | --- | --- | --- | --- |
| I | 15 | 390.5 | 196.6 | 129.0 | | |
| | 30 | 397.2 | 104.0 | 66.4 | — | — |
| | 45 | 120.0 | 73.2 | 58.4 | — | — |
| | 60 | 60.5 | 68.4 | 54.8 | — | — |
| | 75 | 59.4 | 47.3 | 37.4 | — | — |
| | 90 | 85.2 | 69.9 | 55.5 | — | — |
| II | 105 | 18.0 | 17.2 | 13.5 | — | — |
| | 120 | 5.8 | 5.5 | 4.3 | 2.0 | 1.5 |
| III | 135 | 7.0 | 8.8 | 6.9 | 1.7 | 1.3 |

In a preferred embodiment the invention utilizes cerium oxide abrasives on a combination of hard and soft polyurethane pads at pH~5.0 to generate surface finishes between 1.5–2.0 angstrom (Ra and RMS values). Further processing using high pH (~10) colloidal silica solutions are shown to further improve the surface finish to a maximum of Ra=1.3 Å. Overall polishing time is less than 2.5 hours. The invention provides a super polished surface suitable 157 nm microlithography with the use of cerium oxide abrasives with polyurethane pads. The acidic nature of the cerium polish and the high pH of the colloidal silica abrasives are particularly preferred.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. Method of making a below 200 $\mu$m optical microlithography element, said method including:
   providing a fluoride crystal,
   providing a cerium oxide polish,
   polishing said fluoride crystal with said cerium oxide polish to provide a optical microlithography element with a surface roughness <5 angstroms.

2. A method as claimed in claim 1, wherein providing a fluoride crystal comprises providing a calcium fluoride crystal.

3. A method as claimed in claim 1, wherein providing a fluoride crystal comprises providing a barium fluoride crystal.

4. A method as claimed in claim 1 including the step of exposing the VUV optical microlithography element to 157 nm optical lithography radiation.

5. A method as claimed in claim 1, wherein polishing said fluoride crystal includes polishing said fluoride crystal with said cerium oxide polish to provide a microlithography element polished preform with a surface roughness <5 angstroms and forming said polished preform into said VUV optical microlithography element.

6. A method as claimed in claim 1, wherein polishing further includes polishing with a colloidal silica polish after polishing with said cerium oxide polish.

7. A method as claimed in claim 1, wherein polishing with said cerium oxide polish includes polishing with a hard polishing pad having a hardness H, and then polishing with a soft polishing pad having a hardness S, with H>S.

8. A method as claimed in claim 1, wherein providing and polishing with said cerium oxide polish includes providing and polishing with an aqueous cerium oxide polish.

9. A method as claimed in claim 8, wherein providing and polishing with said cerium polish includes providing and polishing with an aqueous cerium polish.

10. A method as claimed in claim 8, wherein providing a fluoride crystal comprises providing a calcium fluoride crystal.

11. A method as claimed in claim 8, wherein providing a fluoride crystal comprises providing a barium fluoride crystal.

12. A method as claimed in claim 8, wherein polishing includes polishing said fluoride crystal with said cerium polish to provide a finished surface with a root mean square roughness (RMS)<2 angstroms and an average roughness (Ra)<2 angstroms.

13. A method as claimed in claim 8, wherein providing a cerium polish includes providing a plurality of cerium oxides abrasive particles in a polishing environment pH from 2 to 12.

14. A method as claimed in claim 8, wherein polishing includes polishing with a polyurethane polishing pad.

15. A method as claimed in claim 8, wherein polishing includes polishing with a polishing pad pressure less than 2 PSI.

16. A method as claimed in claim 8, wherein polishing includes polishing for a polishing time of less than 5 hours.

17. A method as claimed in claim 8, wherein polishing includes polishing for a polishing time of less than 3 hours.

18. A method as claimed in claim 8, wherein polishing includes polishing with a hard polishing pad having a hardness H and then polishing with a soft polishing pad having a hardness S wherein H>S.

19. A method as claimed in claim 8, wherein polishing includes polishing with a acid polishing environment with a pH of about 3 to 7.

20. A method as claimed in claim 8, wherein polishing includes polishing with a first cerium polish, said first cerium polish comprised of cerium abrasive particles having a particle size LPS, and then polishing with a second cerium polish, said second cerium polish comprised of cerium abrasive particles having a particle size SPS, wherein LPS>SPS.

21. A method as claimed in claim 8, wherein polishing includes polishing the cerium polished fluoride crystal with a colloidal silica polish.

22. A method as claimed in claim 8, said method including exposing said polished fluoride crystal to 157 nm laser radiation.

23. A method of making a below 200 nm optical microlithography element preform, said method including:
   providing a fluoride crystal,
   providing a cerium polish,
   polishing said fluoride crystal with said cerium polish to provide a microlithography element polished preform with a surface roughness <5 angstroms.

24. A method of making a below 170 nm optical microlithography preform, said method comprising:
   providing a calcium fluoride crystal having a 157 nm internal transmission>95%/cm,
   providing a cerium polish, said cerium polish including a plurality of cerium oxide particles in a polishing environment,
   polishing said calcium fluoride crystal with said cerium polish to provide a microlithography polished preform surface.

25. A method as claimed in claim 24, said method including decontaminating said polished preform surface.

26. A method as claimed in claim 25 wherein decontaminating includes removing a contaminant particle from said polished preform surface.

27. A method as claimed in claim 25, wherein decontaminating includes removing a reaction product from said polished preform surface.

28. A method as claimed in claim 25 wherein decontaminating includes finishing with a plurality of cerium-free particles.

29. A method as claimed in claim 28 wherein finishing with cerium-free particles includes finishing with colloidal abrasive particles.

30. A method as claimed in claim 28, wherein decontaminating includes finishing with a fixed abrasive pad.

31. A method as claimed in claim 30, wherein said fixed abrasive pad includes diamond.

32. A method as claimed in claim 30, wherein said fixed abrasive pad includes aluminum oxide.

33. A method as claimed in claim 30, wherein said fixed abrasive pad includes silicon dioxide.

34. A method as claimed in claim 30, wherein said fixed abrasive pad includes zirconium dioxide.

35. A method as claimed in claim 30, wherein said fixed abrasive pad includes titanium dioxide.

36. A method as claimed in claim 25 wherein decontaminating includes finishing with a plurality of colloidal silica.

37. A method as claimed in claim 25 wherein decontaminating includes finishing with a plurality of colloidal alumina.

38. A method as claimed in claim 25, wherein decontaminating includes finishing with a plurality of colloidal diamond.

39. A method as claimed in claim 25, wherein decontaminating includes finishing with a plurality of colloidal zirconium dioxide ($ZrO_2$).

40. A method as claimed in claim 25, wherein decontaminating includes finishing with a plurality of colloidal titanium dioxide ($TiO_2$).

41. A method as claimed in claim 24, said method including cleansing said polished preform surface while said surface is an undried polish wet surface.

42. A method as claimed in claim 24, wherein said cerium polish is an aqueous cerium polish.

43. A method as claimed in claim 24, wherein said cerium polish has a pH in the range from 3 to 7 pH.

44. A method as claimed in claim 24, wherein said cerium polish is acidic.

45. A method as claimed in claim 24, wherein said cerium polish has a pH in the range from 3–7.

46. A method as claimed in claim 24, wherein said cerium polish has a pH of about 5.

47. A method as claimed in claim 24, wherein said cerium polish has a cerium oxide solubility in solution less than 1 ppm.

48. A method as claimed in claim 24, wherein said cerium polish acidic polishing environment includes a non-water liquid.

49. A method as claimed in claim 24, wherein polishing includes polishing with a first hard polishing pad having a hardness H, and then polishing with a second soft polishing pad having a hardness S, wherein H>S.

50. A method as claimed in claim 49, wherein said hardness H>25 shore D hardness and hardness S<25 shore D hardness.

51. A method of making a 157 nm VUV optical element preform, said method comprising:
   providing a calcium fluoride crystal having a 157 nm internal transmission>95%cm,
   providing a cerium means for polishing said calcium fluoride crystal into a 157 nm VUV optical element preform with a polished preform surface with a surface roughness <5 angstroms,
   polishing said calcium fluoride crystal with said cerium polishing means to a surface roughness <5 angstroms.

52. A method as claimed in claim 51, wherein providing a cerium means for polishing includes providing an aqueous cerium means for polishing.

53. A method as claimed in claim 51, wherein polishing includes polishing with an overall total polishing time less than about three hours.

54. A method of making a below 200 nm optical microlithography element preform, said method including:
   providing a fluoride crystal,
   providing an aqueous polish,
   polishing said fluoride crystal with said aqueous polish to provide a microlithography element polished preform with a surface roughness <5 angstroms.

55. A method as claimed in claim 54, wherein providing an aqueous polish includes providing an aqueous cerium polish.

56. A method as claimed in claim 54, wherein polishing includes polishing with said aqueous polish to a surface roughness no greater than two angstroms.

* * * * *